Aug. 29, 1972 JEAN-MARC LE DUC 3,687,743

METHOD OF MANUFACTURING A SEMICONDUCTOR DEVICE CONSISTING OF A TERNARY COMPOUND OF ZnSiAs ON A GaAs SUBSTRATE

Filed July 13, 1970

INVENTOR.

BY JEAN-MARC LE DUC

Frank R. Jordan

AGENT

United States Patent Office 3,687,743
Patented Aug. 29, 1972

3,687,743

METHOD OF MANUFACTURING A SEMICONDUCTOR DEVICE CONSISTING OF A TERNARY COMPOUND OF ZnSiAs ON A GaAs SUBSTRATE

Jean-Marc le Duc, Caen, France, assignor to U.S. Philips Corporation, New York, N.Y.

Filed July 13, 1970, Ser. No. 54,099
Int. Cl. H01l 7/38
U.S. Cl. 148—171 2 Claims

ABSTRACT OF THE DISCLOSURE

A method of manufacturing a semiconductor device comprising a semiconductor portion of a compound of the type $A^{II}B^{IV}C_2^{V}$ or a mixed crystal thereof, $A^{II}$ being one of the elements beryllium, magnesium, zinc, cadmium or mercury of the second group, $B^{IV}$ being one of the elements of the fourth group including silicon, germanium, or tin, and $C^{V}$ being one of the elements of the fifth group of the Periodic System including nitrogen, phosphorus, arsenic or antimony. A compound of this type is epitaxially deposited on a substrate consisting of a compound of the type $A^{III}B^{V}$ or mixed crystal from a melt containing the components of the first-mentioned compound or mixed crystals thereof.

The invention relates to a method of manufacturing semiconductor devices of the kind comprising a semiconductor portion of a compound of the type $A^{II}B^{IV}C_2^{V}$ or a mixed crystal thereof, wherein $A^{II}$ is one of the elements beryllium, magnesium, zinc, cadmium or mercury of the second group, $B^{IV}$ is one of the elements silicon, germanium or tin of the fourth group and $C^{V}$ is one of the elements nitrogen, phosphorus, arsenic or antimony of the fifth group of the Periodic System of Elements. Such compounds may be imagined to be derived from compounds of the type $A^{III}B^{V}$ by assuming its $A^{III}$ atoms to be replaced by half by $A^{II}$ atoms and by half by $A^{IV}$ atoms. Examples of these compounds are known per se and their crystal lattices may be considered to be derived either from Wurtzite or from sphalerite. From the last-mentioned lattice is derived the so-called chalcopyrite structure and many of the compounds concerned crystallize in accordance with this crystal type, for example, cadmium silicon phosphide, zinc silicon arsenide and zinc silicon phosphide. These compounds are desirable supplements to the elementary semiconductors silicon and germanium and to compounds of the type $A^{III}B^{V}$, but since the compound comprises three components, the number of variants is much larger. There is furthermore a variation in the form of mixed crystals of these compounds possible.

Although examples of these semiconductor compounds in a fairly pure state have been produced, for example, by controlled solidification of melts of stoichiometric quantities of the ingredients or by transport reaction with the aid of a halogen, the resultant crystal size was too small for practical use, while it appeared to be difficult to obtain p-type material as well as n-type material or even material having a pn-junction.

The present invention has for its object inter alia to provide a method of producing compounds of the type concerned or their mixed crystals in single-crystalline form of reasonably useful size. According to the invention a method of manufacturing semiconductor devices having a semiconductor portion of a compound of the type $A^{II}B^{IV}C_2^{V}$, as defined above, or a mixed crystal thereof is characterized in that a single-crystal substrate of a compound of the type $A^{III}B^{V}$ or a mixed crystal thereof is epitaxially provided with the compound of the type $A^{II}B^{IV}C_2^{V}$ or the mixed crystal thereof from a melt containing the components of the last-mentioned compound or mixed crystal. A suitable method of making such a melt consists in that the deposited compound, which may be obtained by other means, for example, by means of a transport reaction, is dissolved in a suitable solvent of a metal having preferably a comparatively low melting point. Suitable solvents are, for example, tin, lead or bismuth or mixtures thereof, to which, if desired, further ingredients may be added, for example, suitable dopes. For example, it appeared that gallium and aluminum are acceptors and sulphur, selenium and tellrium are donors in zinc silicon arsenide. In principle, it is furthermore possible to act upon the conductivity type by providing in the melt an excess quantity of the $A^{II}$ element, which excess quantity provides acceptor levels in the compound to be crystallized out, or an excess qantity of the $B^{IV}$ element, for example, silicon or germanium, which excess quantity provides donor levels in the material to be crystallized out. If desired, zinc or cadmium itself may be used as a solvent or as a constituent thereof.

In a preferred form the substrate of the type $A^{III}B^{V}$ and the epitaxial semiconductor material of the type $A^{II}B^{IV}C_2^{V}$ contain the same element of the fifth group of the Periodic System. In order to obtain a high perfection of the crystal lattice of the compound to be deposited, the compound and the substrate are preferably chosen so that the corresponding lattice gaps in the two crystal lattices match each other within a tolerance of 5%. The difference between the lattice constants is preferably at the most 2%. In order to deposit zinc silicon arsenide or cadmium silicon phosphide it is preferred to use a substrate of gallium arsenide. The corresponding lattice gaps are 5.60 A., 5.67 A. and 5.65 A. respectively. In order to deposit zinc silicon phosphide (corresponding lattice gap 5.40 A.) a substrate of gallium phosphide (5.45 A.) is used.

In the resultant structure the $A^{III}B^{V}$ substrate of the semiconductor device to be manufactured may, if desired, be maintained. The presence of the hetero-junction may be advantageously utilized, but this is not necessary. The $A^{III}B^{V}$ substrate may be used in known manner as a support, if desired, also for electric connections and only the epitaxially deposited layer may be employed as the semiconductor material determining the essential characteristics of the semiconductor device to be manufactured. For example, pn-junctions may be provided in the epitaxial layer either by liquid epitaxy in two steps with different dopings or by diffusing a suitable dopant. It is furthermore possible to provide contacts of ohmic nature or rectifying contacts, for example, Schottky contacts and, if desired, dopings may be used which are conductive to the production of recombination radiation. After the deposition of the epitaxial layer from the liquid containing the $A^{II}B^{IV}C_2^{V}$ compound solidification of the remainder of the melt may provide a structure comprising an $A^{III}B^{V}$ compound and a contact, between which a segregated layer of the $A^{II}B^{IV}C_2^{V}$ compound is obtained. In known manner the liquid epitaxial deposition is preferably carried out on a flat substrate, on which the melt is deposited at a higher temperature, after which cooling is performed for depositing the epitaxial layer and the remaining melt is removed. To this end, a sliding member may be used for establishing contact between the melt and the substrate, and subsequently for removing the melt from the substrate. The substrate may be located beneath the slide, which is displaced for bringing the melt into contact with the substrate, and, after the deposition of the epitaxial layer, is set back at a lower tempeprautre for sweeping the excess quantity of melt off the substrate. It is alternatively possible to accommodate the substrate in a recess of the slide itself, and to bring it into contact with the melt by displacing the slide and to remove it again from the melt. These methods using such a slide are disclosed in U.S. application Ser. No. 889,026, filed Dec. 30, 1969.

For a further explanation data will be given below for the deposition of an epitaxial layer of zinc silicon arsenide on gallium arsenide. The substrate chosen is a wafer of gallium arsenide, for example, orientated according to a —100— plane. The melt was formed by a solution of zinc silicon arsenide in tin. The zinc silicon arsenide may have been formed previously in a conventional manner by a transport reaction via the vapour phase. The quantities in weight of zinc silicon arsenide may be between 3% and 20% of the quantities by weight of the tin. A quartz shuttle having a recess in the bottom for accommodating the gallium arsenide wafer and a horizontal slide are used above which the material to be melted is arranged. The assembly is heated at a temperature of 700° C., after which the slide is displaced so that the melt flows on the gallium arsenide surface. Subsequently the assembly is cooled gradually and when a low temperature in accordance with the desired layer thickness and the melt composition is reached, the slide is slid back so that the excess quantity of melt is removed from the substrate. A suitable layer thickness obtainable is, for example, 15/$\mu$m., but by experiments those skilled in the art may choose suitable parameters such as initial and end temperatures of the melt during the deposition, the quantity of melt per unit of substrate surface, the concentrations of the components in the melt and the solvent.

The surface of the resultant epitaxial layer may be cleaned in known manner, any excess solidified material resulting from any small residue of melt on the surface of the epitaxial layer being removed after the slide has been slid back.

A semiconductor structure manufactured by the last-mentioned method may serve for semiconductor devices of various kinds, examples of which are presented schematically in cross-sectional views in the accompanying drawings.

Figure 1:
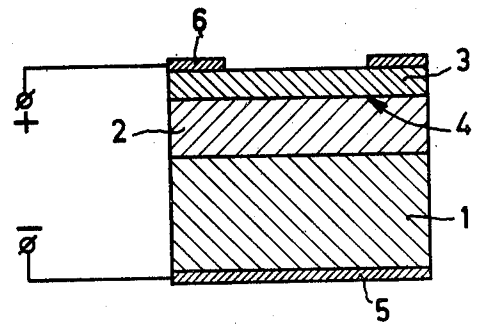
FIG. 1 shows an electro-luminescent diode.

The diode shown in FIG. 1 comprises a substrate 1 of a semiconductive material of the type $A^{III}B^{V}$, such as an-type gallium arsenide having a high dopant concentration, for example, of tellurium. By the above-mentioned method of liquid epitaxial deposition an epitaxial layer is deposited thereon which consists of a semiconductive material of the type $A^{II}B^{IV}C^{V}$ such as zinc silicon arsenide also of the n-type, but having a considerably lower dopant concentration. For this purpose the solution of zinc silicon arsenide in tin has added to it tellurium as a dopant for the formation of the epitaxial layer. The assembly is then exposed to zinc vapour so that the epitaxial layer is divided into an n-type zone 2 adjacent the substrate and a p-type zone 3 having an excess quantity of diffused zinc, which forms a n-junction 4 with the zone 2. When an ohmic contact 5 with the gallium arsenide and an annular ohmic contact 6 with the p-type zinc silicon arsenide zone are provided a luminescent diode is formed, which produces radiation in the visible region, when the contact 6 is biased positively with respect to the contact 5. The emitted radiation is partly located in the visible region of the spectrum. The energy gap in zinc silicon arsenide is 2.2 ev.

Instead of forming a pn-junction by zinc diffusion, the n-type epitaxial layer may be locally metallized with aluminum in order to form an injecting contact. Presumably the effect of such a contact may be based on the presence of a thin layer, for example, of alumina, between the aluminum and the semiconductor, which may allow current to pass due to tunnel effect. Into the zinc silicon arsenide minority charge carriers are injected, which provide by recombination with majority carriers recombination radiation, which is located at least partly in the visible region of the spectrum.

Figure 2:
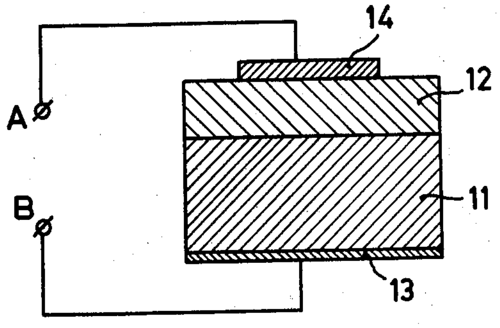
FIG. 2 shows a semiconductor device with voltage-dependent capacitance.

The diode shown in FIG. 2 comprises a substrate 11 of a n-type single-crystal gallium arsenide, on which a layer 12 of zinc silicon arsenide of the n-type is deposited from the liquid phase, however, without the addition of a dopant to the solution in molten tin. The gallium arsenide substrate 11 is provided on the lower side with an ohmic contact 13 and the epitaxial layer of zinc silicon arsenide of n-type conductivity is provided with a Schottky contact 14 of gold. Owing to the presence of the Schottky barrier a strongly voltage-dependent capacitance is formed, which renders the diode suitable for use in parametric amplifiers of devices operating at very high frequencies.

Figure 3:
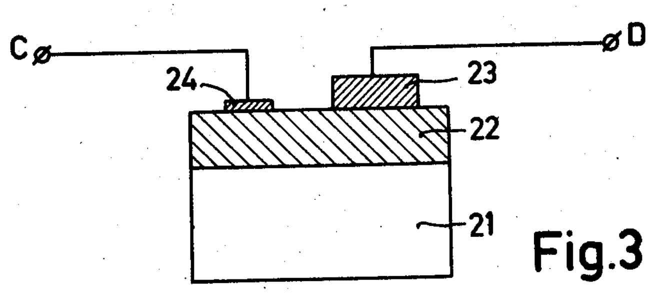
FIG. 3 shows a diode of the Schottky type.

The semiconductor device shown in FIG. 3 comprises a substrate of high-ohmic gallium arsenide doped with chromium, on which an epitaxial layer of substantially intrinsic zinc germanium arsenide is deposited from the liquid phase. The solvent for the deposition of the zinc germanium arsenide from the liquid phase may be lead. The substrate 21 of gallium arsenide, serving as a support for the epitaxial layer 22, is not provided in this case with a contact. An ohmic contact 24 is provided by melting down a solution of zinc germanium arsenide in tin. By local vapour deposition of tin a contact 23 is formed, which forms a contact of the Schottky type with the zinc germanium arsenide. Also this diode is suitable for use in parametric amplifiers.

It is, of course, also possible to form a pn-junction by the choice of substrate and composition of the melt for the formation of the epitaxial layer between the substrate of material of the type $A^{III}B^{V}$ and the epitaxial layer of material of the type $A^{II}B^{IV}C_2^{V}$. It will be obvious that other materials of the type $A^{II}B^{IV}C_2^{V}$ than those mentioned in the present examples may be chosen. Where reference is made herein to a material of the type $A^{III}B^{V}$ or to a material of the type $A^{II}B^{IV}C_2^{V}$, not only compounds of the said type but also mixed crystals thereof are meant.

What is claimed is:

1. A method of manufacturing semiconductor devices comprising a semiconductor portion of zinc silicon arsenide comprising the steps of forming a melt of, and flowing said melt on the surface of a single-crystal substrate of gallium arsenide to epitaxially deposit thereon a crystal of zinc silicon arsenide.

2. A method as claimed in claim 1, wherein a pn-junction is provided in the epitaxial layer by doping said epitaxial layer with at least one dopant which forms two zones of differing conductivity.

References Cited

UNITED STATES PATENTS

| | | | |
|---|---|---|---|
| 3,560,275 | 2/1971 | Kressel et al. | 148—171 |
| 3,537,029 | 10/1970 | Kressel et al. | 331—94.5 |

OTHER REFERENCES

Goryunova, N.: Proceedings of the IX Conference of the Physics of Semiconductors, vol. 2, Leningrad, 1968, pp. 1198–1207.

MARTIN H. EDLOW, Primary Examiner

U.S. Cl. X.R.

148—33, 172; 252—62.3; 317—235 N, 235 AC

PO-1050
(5/69)

UNITED STATES PATENT OFFICE
CERTIFICATE OF CORRECTION

Patent No. 3,687,743 Dated August 29, 1972

Inventor(s) JEAN-MARC LE DUC

It is certified that error appears in the above-identified patent and that said Letters Patent are hereby corrected as shown below:

Column 2, line 12, "tellrium" should read -- tellurium --;

line 53, "conductive" should read -- conducive --.

Column 3, line 48, "an-type" should read -- a n-type --;

line 68, "2.2ev" should read -- 2.2eV --.

Column 4, line 49, after "of" (second occurrence) insert

-- zinc silicon arsenide --.

Signed and sealed this 20th day of March 1973.

(SEAL)
Attest:

EDWARD M.FLETCHER,JR.
Attesting Officer

ROBERT GOTTSCHALK
Commissioner of Patents